United States Patent [19]

Shimochi

[11] Patent Number: 4,959,019

[45] Date of Patent: Sep. 25, 1990

[54] ELECTRIC CONNECTION BOX

[75] Inventor: Eiji Shimochi, Shizuoka, Japan

[73] Assignee: Yazaki Corporation, Tokyo, Japan

[21] Appl. No.: 400,628

[22] Filed: Aug. 30, 1989

Related U.S. Application Data

[63] Continuation-in-part of Ser. No. 358,227, May 30, 1989.

[30] Foreign Application Priority Data

May 31, 1988 [JP] Japan .................................. 63-131708
Aug. 30, 1988 [JP] Japan .................................. 63-213792

[51] Int. Cl.⁵ .......................... H01R 9/09; H01R 25/00
[52] U.S. Cl. ......................................... 439/76; 439/77;
439/115; 439/121; 439/439; 439/883
[58] Field of Search ...................................... 439/76–78,
439/80–82, 110, 115, 119, 121, 329, 436, 439,
709, 711, 712, 721, 883, 889

[56] References Cited

U.S. PATENT DOCUMENTS 4,429,943 2/1984 Inoue ................................. 339/198 R
4,790,760 12/1988 Kreinberg ............................ 439/77

Primary Examiner—Paula A. Bradley
Attorney, Agent, or Firm—Sughrue, Mion, Zinn, Macpeak & Seas

[57] ABSTRACT

An electric connection box includes a pair of upper and lower cases connected together to provide a casing, one of the upper and lower cases having an electrically insulating housing. A wiring assembly is accommodated within the casing and includes an electrically insulating plate and a plurality of bus bars mounted on the insulating plate. External connection terminals are electrically connected to the bus bars and have respective contact portions received within the insulating housing. In one example, each of the external connection terminals includes a base portion, a plurality of contact portions formed on one lateral edge of the base portion, and a bus bar-gripping portion formed on the other lateral edge of said base portion. The base portion is fixed to the case, with the contact portions extending into the housing. When the wiring assembly is covered or enclosed by the covers, the bus bar-gripping portion is press-fitted relative to the bus bar. In another example, each external connection terminal includes a base portion, a plurality of contact portions integral with said base portion and extending upward from a flat surface of said base portion, and a bus bar-gripping portion formed on the other end of the base portion through an upstanding portion.

4 Claims, 6 Drawing Sheets

ELECTRIC CONNECTION BOX

RELATED APPLICATION

This application is a Continuation-in-Part of parent application U.S. Ser. No. 07/358,227, filed on May 30, 1989.

BACKGROUND OF THE INVENTION

This invention relates generally to an electric connection box for automotive wiring and more particularly to such an electric connection box of the type in which bus bars constituting internal circuitry can be easily arranged and mounted in position.

Generally, as shown in FIG. 16, the internal circuitry of a conventional electric connection box is constituted by bus bars which are stamped from a metal sheet and have their end portions and/or intermediate portions thereof bent into upstanding tabs serving as terminals for external connection. However, as shown in FIG. 17, when providing two juxtaposed tabs 2A and 2A on a bus bar 1A interposed between two bus bars 1B and 1C, it is necessary to provide respective roundabout portions 1B' and 1C' in the adjacent bus bars in order to accommodate the portions 2A', which are the tabs 2A prior to bending. This lowers the yield of the stamping operation and the density of the mounting of the bus bars, and also makes the circuitry complicated.

To overcome this difficulty, there has been proposed an electric connection box as shown in FIG. 18. More specifically, a plurality of parallel bus bars 4 are mounted along respective edges thereof on a lower case 3; the lower case 3 also serving as an insulating plate. Branch bus bars 5 are mounted on the bus bars 4. A body 5a of each branch bus bar 5 is bent at one end 5b into an L-shape, and the other end portion 5c serves as a contact portion for connection to an external circuit. The L-shaped portion 5b of each branch bar 5 is fixedly secured to a respective one of the bus bars 4 by welding, such as spot welding, and then an upper case 6 is connected to the lower case 3, so that the contact portions 5c are received in position in various insulating housings, such as a connector housing 7a, a fuse cavity 7b and a relay cavity 7c, provided on the upper case 6.

Since the bus bars 4 and the branch bus bars 5 are fixedly connected together by welding, it is rather difficult to accurately position the contact portions 5c relative to one another and also relative to the above insulative housings. Particularly, when a plurality of branch bars 5 are fixedly connected to one bus bar 4, the overall shape of such bus bar arrangement becomes complicated, and if the order of the assemblage is wrong, the assemblage must be redone. This leads to low productivity.

SUMMARY OF THE INVENTION

It is therefore an object of this invention to provide an electric connection box in which the density of the bus bars is high, and terminals for connection to external circuits or devices can be easily mounted on the bus bars and arranged in position, thereby enhancing the productivity of the electric connection box.

According to the present invention, there is provided an electric connection box comprising a pair of upper and lower cases connected together to provide a casing, one of the upper and lower cases having an electrically insulating housing; a wiring assembly accommodated within the casing and including an electrically insulating plate and a plurality of bus bars mounted on the insulating plate; and external connection terminals electrically connected to the bus bars and having respective contact portions received within the insulating housing. Each of the external connection terminals includes a base portion fixed to one of the cases, a plurality of the contact portions formed on one lateral edge of the base portion and extending into the housing, and a bus bar-gripping portion formed on the other lateral edge of the base portion and press-fitted relative to the bus bar.

Alternatively, each external connection terminal includes a plurality of upstanding branch contact portions extending from one end of a base portion of said external connection terminal, and a bus bar gripping portion formed on the other end of said base portion through an upstanding portion; said bus bar gripping portion has a slot which opens in a direction toward a plane in which said base portion lies.

DESCRIPTION OF THE PREFERRED EMBODIMENTS

Figure 1:
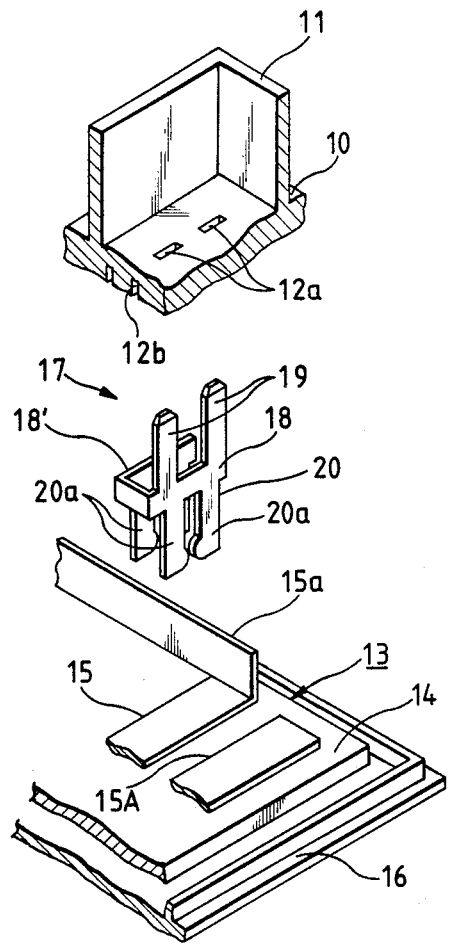
FIG. 1 is a fragmentary, partly-broken, exploded perspective view of an electric connection box provided in accordance with the present invention.

The invention will now be described with reference to the drawings in which like reference numerals denote corresponding parts in several views.

An electric connection box shown in FIG. 1 includes an upper cover 10 having an insulating housing 11 of a generally box-like shape. The upper cover 10 has a plurality of holes 12a formed through a bottom wall thereof, and a plurality of press-fitting grooves 12b formed in the underside of the bottom wall. A wiring assembly 13 comprises an electrically-insulating plate 14, and a plurality of bus bars 15, 15A . . . . Each bus bar 15 has at one end an integral bent plate portion 15a disposed vertically. The wiring assembly 13 is supported on a lower case 16 which is adapted to be connected to the upper case 10. The insulating plate 14 may be omitted, in which case the bus bars 15, 15A . . . are mounted directly on the lower case 16.

Reference numeral 17 denotes a terminal (hereinafter referred to as "external connection terminal") for connection to an external circuit or device. The external connection terminal 17 is formed from one metal sheet by stamping and bending. The terminal 17 includes a base portion 18, branch contact portions 19 extending from one lateral edge of the base portion 18, and a bus bar-gripping portion 20 (two portions 20 are shown in the illustrated embodiment) formed on the other lateral edge of the base portion 18. The branch contact portions 19 are in the form of tabs, and in this embodiment the number of the branch contact portions 19 is two, but this number may be more than two. The bus bar-gripping portion 20 comprises a pair of opposed holder sections 20a and 20a extending from the other lateral edge of the base portion 18, the pair of holder sections 20a and 20a having respective distal ends of a generally hook-shape disposed in opposed relation to each other. Preferably, the base portion 18 is formed into a U-shape, and a pair of bus bar-gripping portions 20 are formed on opposed arms of the U-shaped base portion 18 in opposed relation to each other.

Figure 2:
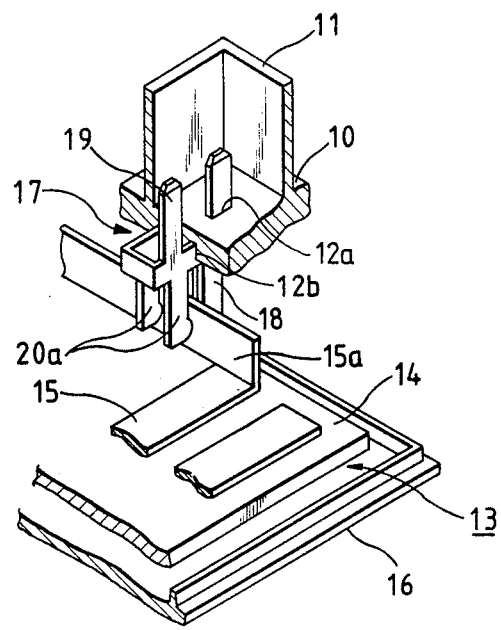
FIG. 2 is a fragmentary, partly-broken perspective view of the electric connection box.
Figure 3:
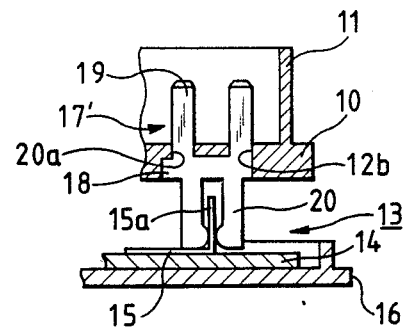
FIG. 3 is a fragmentary cross-sectional view of the electric connection box.

When the electric connection box is to be assembled as shown in FIGS. 2 and 3, the branch contact portions 19 of the external connection terminal 17 extend into the insulative housing 11 through the through holes 12a of the upper case 10, with the base portion 18 press-fitted in the press-fitting groove 12b to fix the external connection terminal 17 to the upper case 10. Then, when the upper case 10 with the external connection terminal 17 is placed on the wiring assembly 13, the vertical bent plate portion 15a of the bus bar 15 snugly fits between the two pairs of the holder sections 20a of the two bus bar-gripping portions 20, so that the holder sections 20a resiliently engage the vertical bent plate portion 15a, thereby making an electrical connection between the bus bar 15 and the external connection terminal 17. Then, the lower case 16 is connected to the upper case 10, thus completing the assembly of the electric connection box. Alternatively, the wiring assembly 13 may be mounted on the lower case 16 before the external connection terminal 17 is connected to the bus bars 15.

Figure 4:
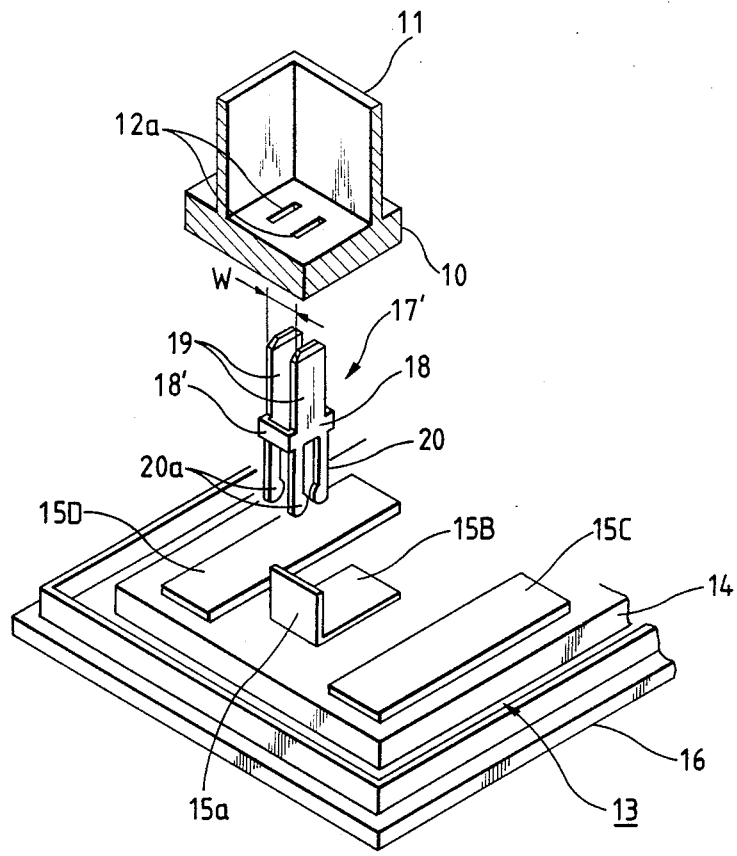
FIG. 4 is a view similar to FIG. 1, but showing a modified electric connection box.
Figure 5:
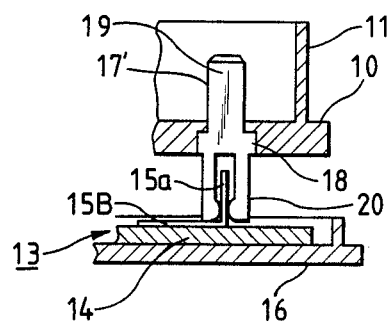
FIG. 5 is a fragmentary cross-sectional view of the electrical connection box of FIG. 4.

FIGS. 4 and 5 show a modified form of the invention in which the pair of opposed branch contact portions 19 and 19 are formed respectively on opposed arms of the U-shaped base portion 18 of an external connection terminal 17'. In this embodiment, the distance w between the pair of opposed branch contact portions 19 and 19 is relatively small. Therefore, this construction is advantageous when a bus bar 15B, to which the external connection terminal 17' is to be connected, is disposed between two bus bars 15C and 15D in such a manner that the spaces on the opposite sides of the bus bar 15B are small.

Figure 6:
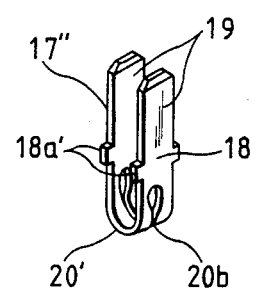
FIG. 6 is a perspective view of a modified external connection terminal.

FIG. 6 shows another modified external connection terminal 17". The terminal 17" includes a flat elongated body which is bent longitudinally into a U-shape, and opposed distal or free end portions thereof serve as a pair of branch contact portions 19 and 19, each in the form of a tab. A slot 20b is formed in the U-shaped end portion remote from the contact portions 19 and extends from a point near one base portion 18 to a point near the other base portion 18 to bifurcate the U-shaped end portion. This bifurcated portion serves as a bus-bar gripping portion 20'. The end portions 18a' of the base portions 18 are adapted to be press-fitted in the press-fitting grooves 12b.

Figure 7A:
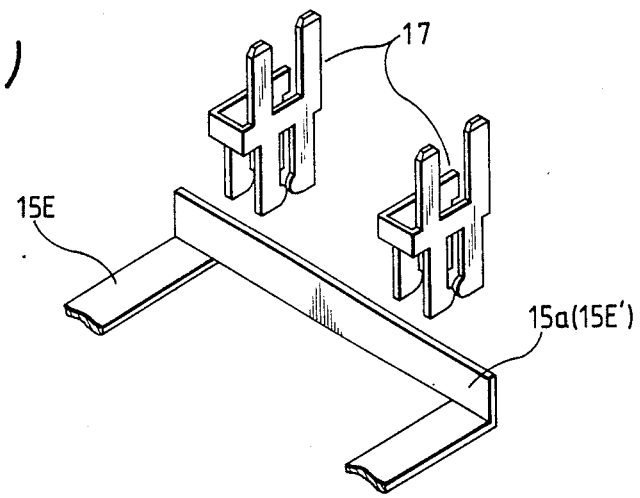
FIG. 7(a) is a perspective view showing one example of the arrangement of the external connection terminals of FIG. 1.
Figure 7B:
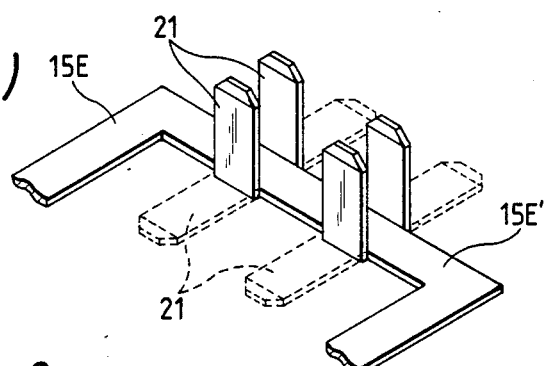
FIG. 7(b) is a perspective view of a conventional bus bar.

FIG. 7(a) shows another arrangement of the external connection terminals 17 of FIG. 1. One conventional bus bar 15E has four tabs 21 (external connection terminals) formed on opposite edges of a portion 15E' of the bus bar 15E (FIG. 7(b)). According to the present invention, the function of this conventional bus bar 15E can be obtained by bending a portion 15a (corresponding to the portion 15E' of FIG. 7(b), but having no tab 21) to provide a vertical bent plate portion and by connecting two external connection terminals 17 to the vertical bent plate portion 15a through the holder sections 20a press-fitted on the vertical bent plate portion 15a.

Figure 8:
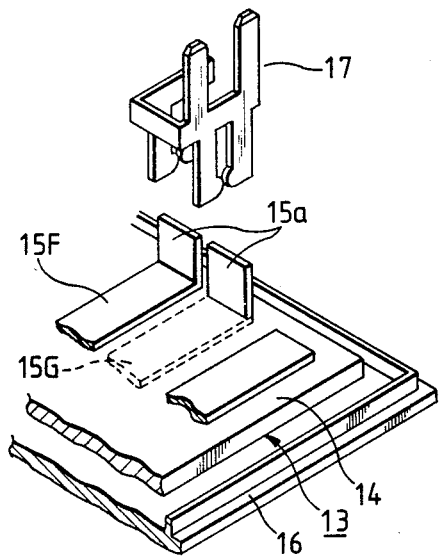
FIG. 8 is a perspective view showing another example of the arrangement of the external connection terminals of FIG. 1.

FIG. 8 shows a further arrangement of the external connection terminal 17 of FIG. 1. In this case, one external connection terminal 17 is connected to vertical bent plate portions 15a and 15a of two bus bars 15F and 15G disposed respectively in first and second layers of the insulating plate 14, thereby making a short circuit between the two bus bars 15F and 15G. The two pairs of bus bar-gripping portions 20 and 20 are press-fitted, respectively, on the vertical bent plate portions 15a and 15a of the two bus bars 15F and 15G.

Figure 18:
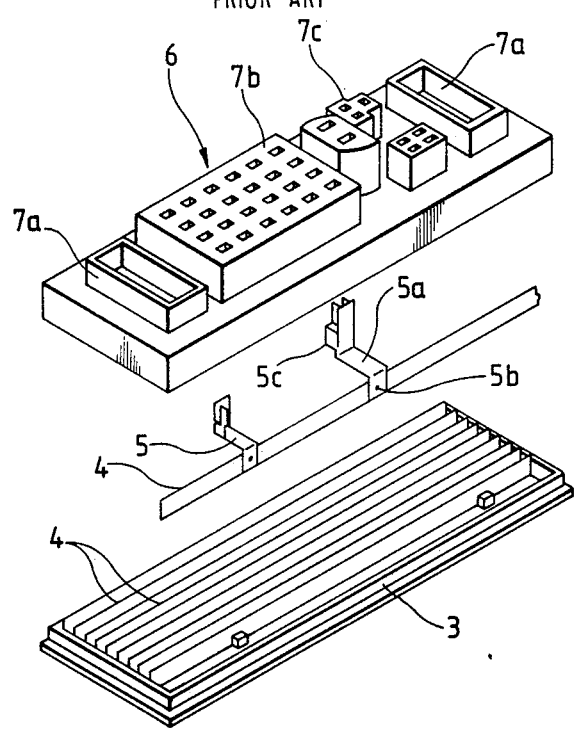
FIG. 18 is an exploded perspective view of a proposed electric connection box.

In the above embodiments, the external connection terminals 17, 17' and 17" are press-fitted on the vertical bent plate portions 15a of the bus bars 15, 15A, 15B, etc., which are disposed flat relative to the insulating plate 14. However, if the external connection terminals 17, 17' and 17" are to be connected to bus bars 4 disposed perpendicular to the insulative plate as shown in FIG. 18, the external connection terminals can be press-fitted directly on the bus bar bodies. Therefore, the wiring assembly 13 can be so constructed as to include a combination of the flat bus bars 15, 15A, 15B, . . . and perpendicular bus bars 4.

In the above embodiments, although the fixing of the external connection terminals to the case is made by the press-fitting method, this fixing can be made by a so-called case-lance method or a housing-lance method. In short, any fixing method can be used so long as the external connection terminals can be properly positioned beforehand.

As described above, in the present invention, the external connection terminal 17, 17', 17" can be easily connected to the vertical bent plate portion 15a of the perpendicular bus bar 4 (FIG. 18) through the bus bar-gripping portions 20 press-fitted thereto. Moreover, the positioning of the external connection terminal can be easily made beforehand by press-fitting the base portion 18 in the press-fitting grooves 12b, which are formed in the upper case 10 or may be formed in the lower case 16.

Therefore, there is almost no need to provide the above-mentioned tabs 21 on the bus bars 15, 15A, 15B . . . arranged flat relative to the insulative plate 14. This can simplify the construction of the circuitry constituted by the bus bars.

Figure 9:
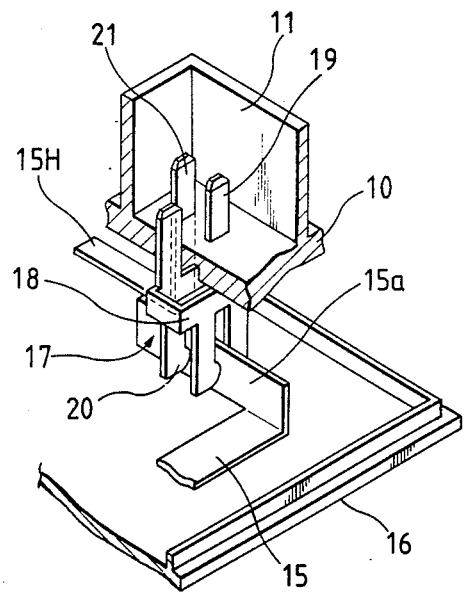
FIG. 9 is a perspective view of an important portion of an electric connection box having a combination of an ordinary bus bar and a bus bar having a vertical bent plate portion.
Figure 10:
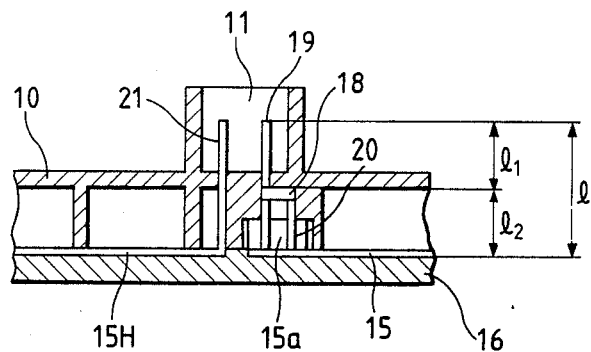
FIG. 10 is a cross-sectional view of the important portion of FIG. 9.

FIG. 9 is a perspective view and FIG. 10 is a cross-sectional view of a portion of an electrical connection box using a combination of a conventional type bus bar and a bus bar of the invention herein. Bus bar 15H, having upstanding tab 21, is of the conventional type. Bus bar 15, with bent plate portion 15a and external connection terminal 17, is of the type described above. The height of the external connection terminal 17 extending between its upper and lower ends is indicated by reference character l. However, that portion of the terminal 17 which is actually used for connection to an external connector terminal or the like is the portion $l_1$ of the branch contact portion 19. The base portion 18 and the bus bar-gripping portion 20 which are indicated by reference character $l_2$ contribute to an increased bulk of the upper and lower case 10 and 16. The tab 21 on the bus bar 15H usually has a length $l_1$. However, that length must be increased by an amount of $l_2$ so as to correspond to the length l of the terminal 17. Accordingly, the developed length of the bus bar is increased by that amount, which results in a problem that the yield of the stamping of the bus bar and the density of the mounting of the bus bars are lowered.

A second feature of the invention, as shown in FIGS. 11–15, seeks to overcome the latter problem.

Figure 11:
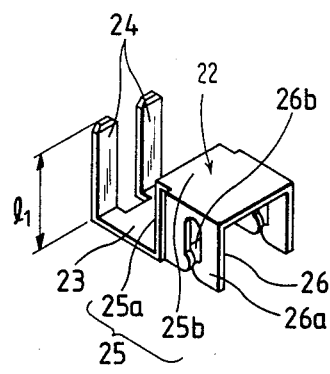
FIG. 11 is a perspective view of an external connection terminal provided in accordance with a second embodiment of the invention.

An external connection terminal 22 shown in FIG. 11 includes a plurality of upstanding branch contact portions 24 formed on one end of a base portion 23 by bending, and bus bar-gripping portions 26 formed on the other end of the base portion through an upstanding portion 25, each bus bar-gripping portion 26 having a slot 26b which opens in a direction toward a plane in which the base portion 23 lies. The upstanding portion 25 has a rear plate 25a facing the branch contact portions 24, and a top plate 25b extending perpendicularly from a free end of the rear plate 25a away from the branch contact portions 24, the top plate 25b being formed by bending. The bus bar-gripping portions 26 each have a pair of holder sections 26a and 26a and the slot 26b depends from the opposite side edges of the top plate 25b, respectively. Thus, the branch contact portions 24 and the bus bar gripping portions 26 extend in opposite directions, that is upwardly and downwardly, with the rear plate 25a interposed therebetween, and the pair of bus bar-gripping portions 26 and 26 are disposed in opposed relation to each other and each pair 26 is disposed in a plane perpendicular to the plane of branch contact portions 24.

In the case of the external connection terminal 22, the bus bar-gripping portion 26 is disposed within the range of the dimension (height) $l_1$ of the branch contact portion 24.

Figure 12:
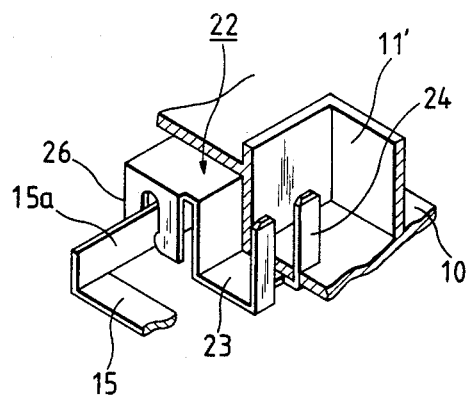
FIG. 12 is a perspective view of an important portion of the second embodiment of the invention.
Figure 13:
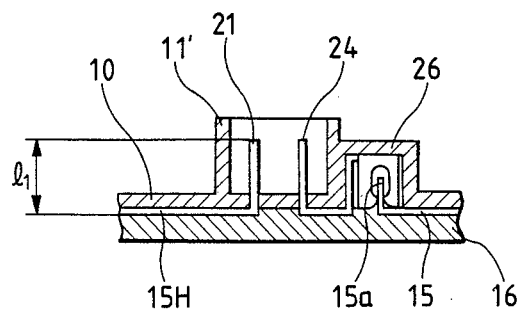
FIG. 13 is a cross-sectional view of the important portion of FIG. 12.

Therefore, as shown in FIGS. 12 and 13, the press-fit connection between the vertical bent plate portion 15a of the bus bar 15 and the bus bar-gripping portion 26 can be achieved within the range of the height $l_1$ of the branch contact portion 24. A comparison of this arrangement with the arrangement shown in FIGS. 9 and 10 clearly indicates that the bulk between the upper and lower cases 10 and 16 is reduced by an amount of $l_2$, and the bus bar 15H having the ordinary tabs 21 having a standard length $l_1$ can be used.

FIGS. 12 and 13 show an example in which the bus bars 15, 15H . . . are mounted directly on the lower case 16. The branch contact portions 24 and the tab 21 are beforehand forcibly passed through the through holes 12a' of the insulative housing 11' and are fixed relative thereto, as described above in FIGS. 2 and 3.

Figure 14:
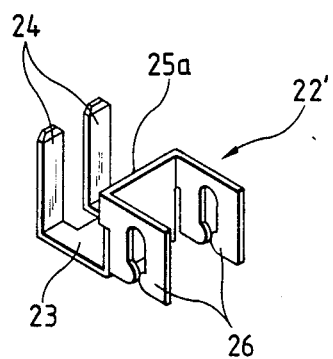
FIGS. 14 and 15 are perspective views of modified external connection terminals of the second embodiment of the invention.
Figure 15:
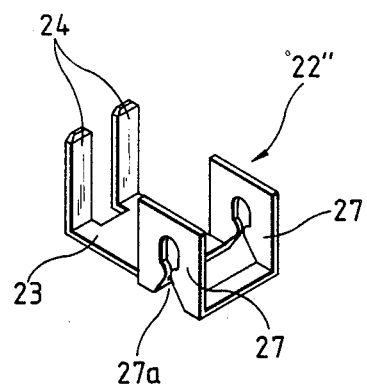
Figure 16:
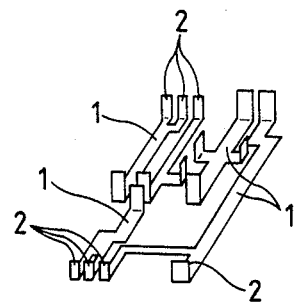
FIG. 16 is a perspective view of conventional bus bars.
Figure 17:
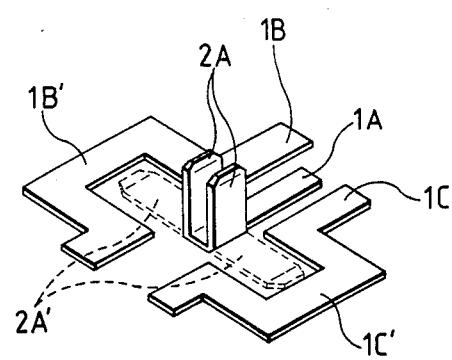
FIG. 17 is an enlarged perspective view of a portion of the conventional bus bars of FIG. 16.

In an external connection terminal 22', shown in FIG. 14, the top plate 25b shown in FIG. 11 is omitted, and the bus bar-gripping portions 26 are connected directly to the opposite sides of the rear plate 25a. An external connection terminal 22" shown in FIG. 15 has upstanding side walls 27 formed on opposite sides of the other end of the base portion 23, the side walls 27 defining the upstanding portion 25 and the bus bar-gripping portions 26. In this case, each side plate 27 is cut upwardly to provide a slot 27a which extends downwardly beyond the plane in which the base portion 23 lies. The external connection terminals 22' and 22" shown respectively in FIGS. 14 and 15 achieve the same effects as the above-mentioned terminal 22.

In the case of the external connection terminals 22, 22' and 22" according to a second embodiment of the invention, the height of the terminal is reduced to almost a half of the height of the terminals of the first embodiment, thus avoiding a bulky construction of the electric connection box. Also, a reduction of the developed length of the tab of the bus bar enhances the stamping yield and the mounting density.

The simplified circuit construction of the bus bars improves the yield of stamping for forming the bus bars and also increases the density of the mounting of the bus bars. Further, the positioning and mounting of the external connection terminals can be made easily, thereby greatly improving the productivity of the electric connection box.

What is claimed:

1. In an electric connection box of the type having a pair of upper and lower cases connected together to provide a casing, one of said upper and lower cases having an electrically insulating housing; a wiring assembly accommodated within said casing and including an electrically insulating plate and a plurality of bus bars mounted on said insulating plate; and external connection terminals electrically connected to said bus bars and having respective contact portions received within said insulating housing;

the improvement comprising, each of said external connection terminals including a base portion, a plurality of said contact portions formed integrally with said base portion and extending into said housing, and a bus bar-gripping portion formed integrally with said base portion press-fitted relative to said bus bar;

wherein said contact portions extend perpendicularly upward from the plane of said base portion at one end of said base portion, and said bus bar-gripping portion extends from the other end of said base portion; said bus bar-gripping portion including two sets of opposed holder sections for gripping said bus bar portion; each said holder section having two legs with a separation therebetween facing downward relative to said base portion; and each said holder section being joined to said other end of said base portion by a bent portion.

2. An electric connection box according to claim 1, wherein said bent portion comprises a flat upstanding plate extending upward from said other end of said base portion and a flat parallel plate extending from the upper end of said upstanding plate and being parallel to said base portion; each said holder section extending downward from said flat parallel plate.

3. An electric connection box as claimed in claim 1, wherein said bent portion comprises a flat upstanding plate extending upward from said other end of said base portion; and each holder section extending perpendicularly from said flat upstanding plate away from the direction of said contact portions.

4. An electric connection box as claimed in claim 1, wherein said bent portion extends from said other end of said base portion to the bottom of one leg each of said two holder sections.

* * * * *